(12) United States Patent
Kim et al.

(10) Patent No.: US 8,242,506 B2
(45) Date of Patent: Aug. 14, 2012

(54) ARRAY SUBSTRATE AND METHOD OF MANUFACTURING THE SAME

(75) Inventors: Jang-Soo Kim, Yongin-si (KR); Jae-Hyoung Youn, Seoul (KR)

(73) Assignee: Samsung Electronics Co., Ltd. (KR)

(*) Notice: Subject to any disclaimer, the term of this patent is extended or adjusted under 35 U.S.C. 154(b) by 531 days.

(21) Appl. No.: 12/273,661

(22) Filed: Nov. 19, 2008

(65) Prior Publication Data

US 2009/0166635 A1 Jul. 2, 2009

(30) Foreign Application Priority Data

Jan. 2, 2008 (KR) ........................ 10-2008-0000253

(51) Int. Cl.
*H01L 21/00* (2006.01)
*G02F 1/1343* (2006.01)
(52) U.S. Cl. .............. 257/72; 257/59; 257/E21.002; 349/56; 349/139
(58) Field of Classification Search ............ 257/59, 257/72; 349/139, 56
See application file for complete search history.

(56) References Cited

U.S. PATENT DOCUMENTS 7,567,321 B2 * 7/2009 Yoon ............................ 349/129
7,859,639 B2 * 12/2010 Ahn ............................. 349/187

* cited by examiner

*Primary Examiner* — Kenneth Parker
*Assistant Examiner* — Jose R Diaz
(74) *Attorney, Agent, or Firm* — Cantor Colburn LLP

(57) ABSTRACT

An array substrate includes a base substrate, a gate line, a gate insulation layer, a data line, a thin-film transistor ("TFT") and a pixel electrode. The gate line includes a gate covering line formed in a first direction on the base substrate and a gate main line protruded from the gate covering line. The gate insulation layer is formed on the base substrate to cover the gate line. The data line is formed on the gate insulation layer in a second direction crossing the first direction. The TFT is electrically connected to the gate line and the data line. The pixel electrode is electrically connected to the TFT. Therefore, a gate line is thicker than a gate covering line and a gate main line having a low resistance is further formed, so that a gate signal may be quickly transferred along the gate line without a signal delay.

20 Claims, 9 Drawing Sheets

ARRAY SUBSTRATE AND METHOD OF
MANUFACTURING THE SAME

This application claims priority to Korean Patent Application No. 2008-253, filed on Jan. 2, 2008, and all the benefits accruing therefrom under 35 U.S.C. §119, the contents of which in its entirety are herein incorporated by reference.

BACKGROUND OF THE INVENTION

1. Field of the Invention

The present invention relates to an array substrate and a method of manufacturing the array substrate. More particularly, the present invention relates to an array substrate used for a liquid crystal display ("LCD") device and a method of manufacturing the array substrate.

2. Description of the Related Art

Generally, a liquid crystal display ("LCD") device includes an LCD panel displaying an image using light and a backlight assembly providing the LCD panel with the light.

The LCD panel includes a first substrate, a second substrate opposite to the first substrate and a liquid crystal layer interposed between the first and second substrates. The first substrate has a gate line formed along a first direction to transfer a gate signal, a data line formed along a second direction crossing the first direction to transfer a data signal, a thin-film transistor ("TFT") electrically connected to the gate line and the data line and a pixel electrode electrically connected to the TFT.

The gate signal is transferred along the gate line to be applied to a gate electrode of the TFT. The gate signal that is applied to the gate electrode turns on the TFT, so that the data signal that is applied through the data line is transferred to the pixel electrode.

BRIEF SUMMARY OF THE INVENTION

It has been determined herein, according to the present invention, that as the gate line is formed in a thin-film type in a conventional LCD panel, the gate line may have a relatively high resistance so that a signal delay may be generated when the gate signal is transferred along the gate line. Recently, as a size of the conventional LCD panel is increased and a length of the gate line is increased, the delay of the gate signal may be increased.

The present invention provides an array substrate capable of decreasing a signal delay of a gate line.

The present invention also provides a method of manufacturing the above-mentioned array substrate.

In one aspect of the present invention, an array substrate includes a base substrate, a gate line, a gate insulation layer, a data line, a thin-film transistor ("TFT") and a pixel electrode.

The gate line includes a gate covering line formed in a first direction on the base substrate and a gate main line protruded from the gate covering line. The gate insulation layer is formed on the base substrate to cover the gate line. The data line is formed on the gate insulation layer in a second direction crossing the first direction. The TFT is electrically connected to the gate line and the data line. The pixel electrode is electrically connected to the TFT.

In an exemplary embodiment, the base substrate may have a gate receiving groove formed thereon, which receives the gate main line. Here, an upper surface of the gate main line received in the gate receiving groove may be substantially coplanar with an upper surface of the base substrate.

In an exemplary embodiment, a gate buffer layer may be further formed between the base substrate and the gate line, the gate buffer layer has a gate receiving groove that receives the gate main line. Here, an upper surface of the gate main line received in the gate receiving groove may be substantially coplanar with an upper surface of the gate buffer layer.

In an exemplary embodiment, a thickness of the gate main line may be thicker than that of the gate covering line.

In an exemplary embodiment, the gate covering line may include a gate covering portion formed along the first direction to cover the gate main line, and a laser shorting portion protruded from the gate covering portion toward the pixel electrode to be overlapped with a portion of the pixel electrode. A gate electrode of the TFT may be protruded from the gate covering portion toward the pixel electrode. A portion of the gate main line may be formed below the gate electrode to be covered by the gate electrode.

In an exemplary embodiment, the data line may include a data main line formed along the second direction, and a data covering line formed along the second direction to cover the data main line.

In an exemplary embodiment, the data covering line may be formed on the gate insulation layer, and the data main line may be formed on the data covering line. Here, the array substrate may further include a data buffer layer formed on the gate insulation layer to cover the data line. The data buffer layer may have a data receiving hole for receiving the data main line.

Alternatively, the data main line may be formed on the gate insulation layer, and the data covering line may be formed on the data main line. Here, the gate insulation layer may have a data receiving groove formed through the gate insulation to receive the data main line.

In another aspect of the present invention, a method of manufacturing an array substrate includes forming a gate receiving groove on a base substrate in a first direction. Then, a gate main line is formed in the gate receiving groove. Then, a gate metal pattern is formed on the base substrate. The gate metal pattern includes a gate covering line covering the gate main line to contact with the gate main line and a gate electrode connected to the gate covering line. Then, a gate insulation layer is formed on the base substrate to cover the gate metal pattern. Then, a data metal pattern is formed on the gate insulation layer. The data metal pattern includes a data line disposed in a second direction crossing the first direction, a source electrode electrically connected to the data line, and a drain electrode spaced apart from the source electrode. Then, a pixel electrode electrically connected to the drain electrode is formed on the data metal pattern.

In an exemplary embodiment, the gate main line and the gate covering line may be formed from the same material, and the gate covering line may fully cover a full area of the gate main line. Alternatively, the gate main line and the gate covering line may be formed from different materials with each other, and the covering line may partially cover at least a portion of the gate main line.

In still another aspect of the present invention, a method of manufacturing an array substrate includes forming a gate buffer layer on a base substrate. Then, a portion of the gate buffer layer is etched to form a gate receiving groove on a base substrate in a first direction. Then, a gate main line is formed in the gate receiving groove. Then, a gate metal pattern is formed on the gate buffer layer. The gate metal pattern includes a gate covering line covering the gate main line to contact with the gate main line and a gate electrode connected to the gate covering line. Then, a gate insulation layer is formed on the base substrate to cover the gate metal pattern. Then, a data metal pattern is formed on the gate insulation layer. The data metal pattern includes a data line disposed in a second direction crossing the first direction, a source electrode electrically connected to the data line and a drain electrode spaced apart from the source electrode. Then, a pixel electrode electrically connected to the drain electrode is formed on the data metal pattern.

In an exemplary embodiment, the gate main line and the gate covering line may be formed from the same material, and the gate covering line may fully cover a full area of the gate main line. Alternatively, the gate main line and the gate covering line may be formed from different materials with each other, and the covering line may partially cover at least a portion of the gate main line.

According to the present invention, a gate line is thicker than a gate covering line and a gate main line having a low resistance is further formed, so that a gate signal may be quickly transferred along the gate line without a signal delay.

BRIEF DESCRIPTION OF THE DRAWINGS

The above and other features and advantages of the present invention will become readily apparent by reference to the following detailed description when considered in conjunction with the accompanying drawings wherein.

DETAILED DESCRIPTION OF THE INVENTION

Figure 1:
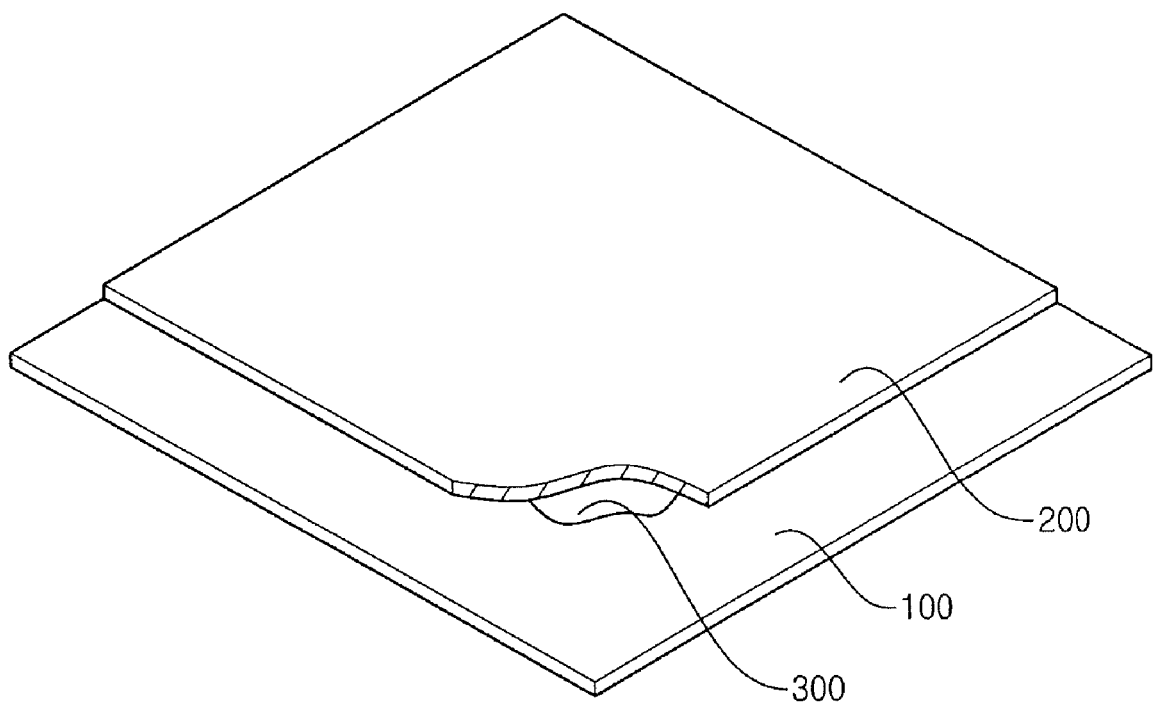
FIG. 1 is a perspective view schematically illustrating an exemplary display device according to a first exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be described in detail with reference to the accompanying drawings.

FIG. 1 is a perspective view schematically illustrating an exemplary display device according to a first exemplary embodiment of the present invention.

Referring to FIG. 1, a display device according to a first exemplary embodiment of the present invention includes a first substrate (which will be referred to hereinafter as an array substrate) 100, a second substrate (which will be referred to hereinafter as an opposite substrate) 200 and a liquid crystal layer 300, and displays an image using lights.

The array substrate 100 may include a plurality of pixel electrodes disposed in a matrix shape, a plurality of thin-film transistors ("TFTs") applying a driving voltage to each of the pixel electrodes, and a plurality of signal lines for driving the TFTs.

The opposite substrate 200 may be disposed to face the array substrate 100. The opposite substrate 200 may include a plurality of color filters formed in correspondence with a unit pixel and a common electrode formed on a base substrate. The color filters may include, for example, a plurality of red filters, a plurality of green filters and a plurality of blue filters. In this embodiment, the color filters are formed on the opposite substrate 200. Alternatively, the color filters may be formed on the array substrate 100. The common electrode may include an optically transparent and electrically conductive material.

The liquid crystal layer 300 is interposed between the array substrate 100 and the opposite substrate 200. An arrangement of liquid crystal molecules of the liquid crystal layer 300 may be altered by an electric field formed between the pixel electrodes and the common electrode. Therefore, when an electric field is applied to the liquid crystal layer 300, an arrangement of liquid crystal molecules of the liquid crystal layer 300 is altered to change optical transmissivity, so that an image is displayed.

The display device may include a backlight assembly (not shown) disposed below the array substrate 100 to provide the array substrate 100 with light.

Figure 2:
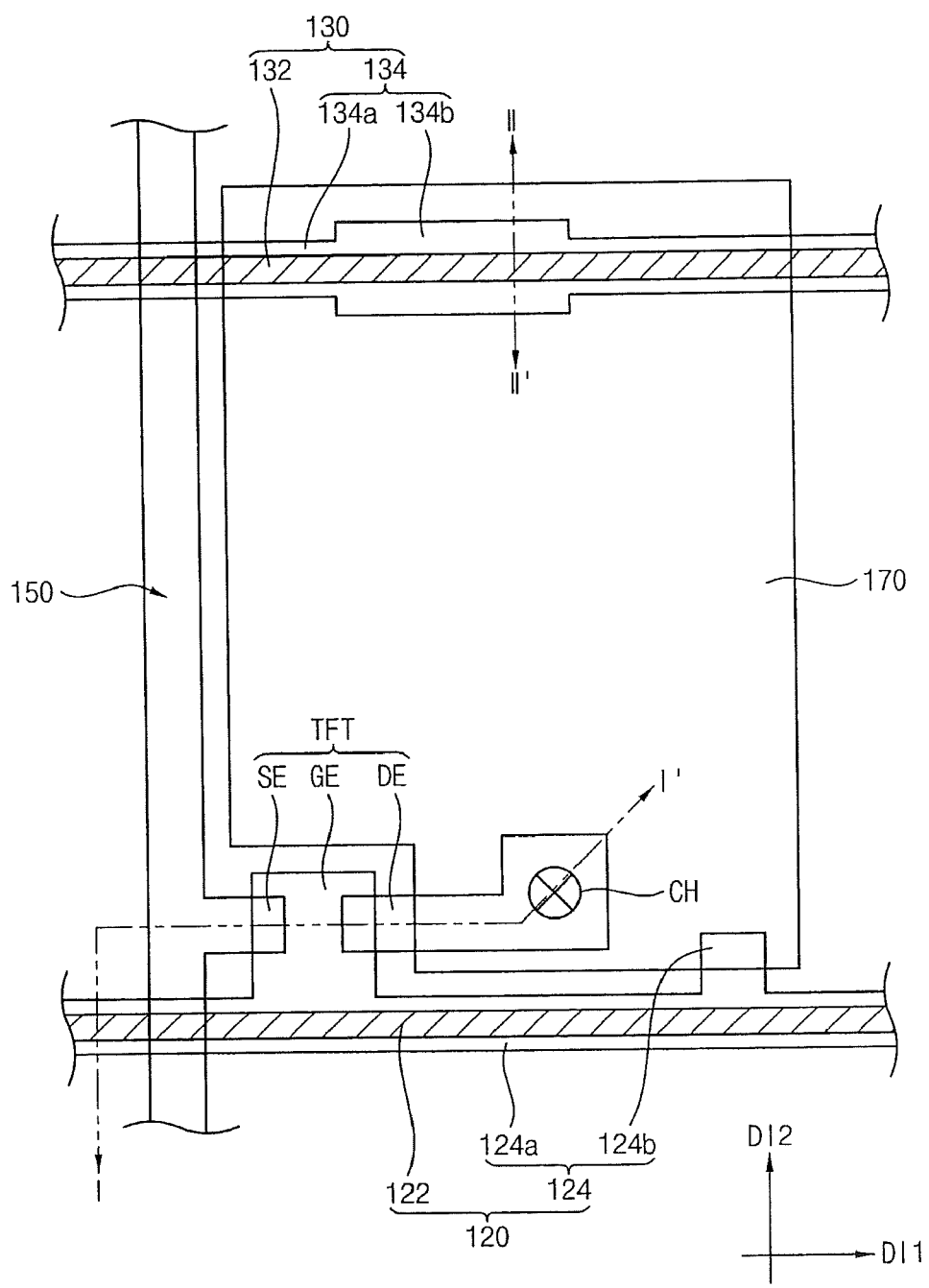
FIG. 2 is an enlarged plan view schematically illustrating a portion of an exemplary array substrate of the exemplary display device of FIG. 1.
Figure 3:
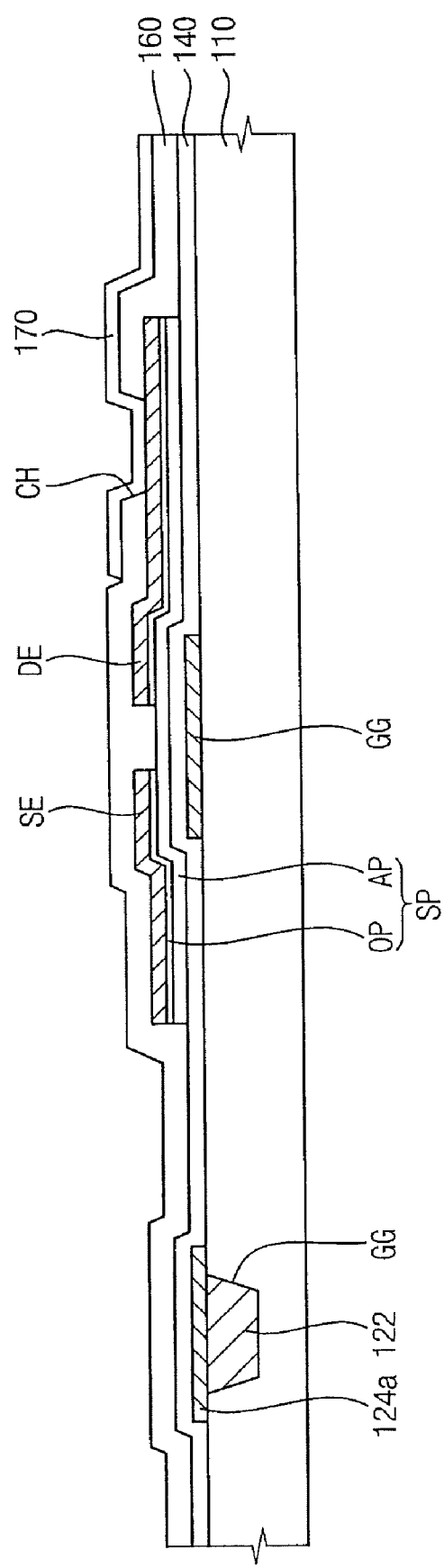
FIG. 3 is a cross-sectional view taken along line I-I' of FIG. 2.
Figure 4:
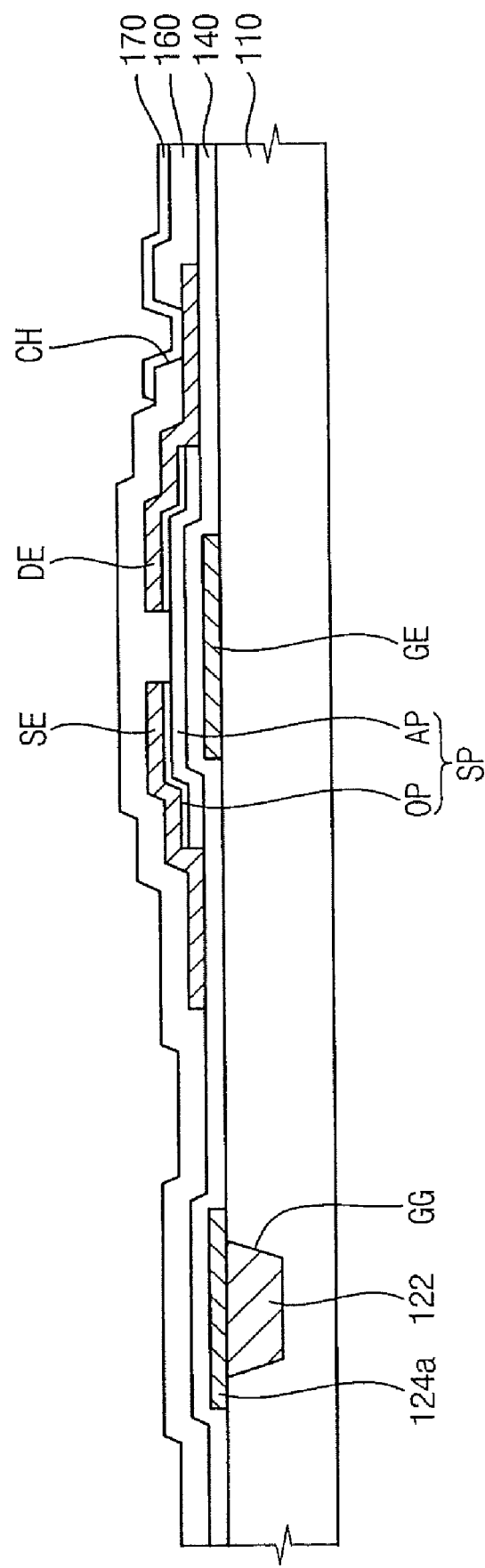
FIG. 4 is a cross-sectional view schematically illustrating an exemplary thin-film transistor ("TFT") having another shape different from FIG. 3.
Figure 5:
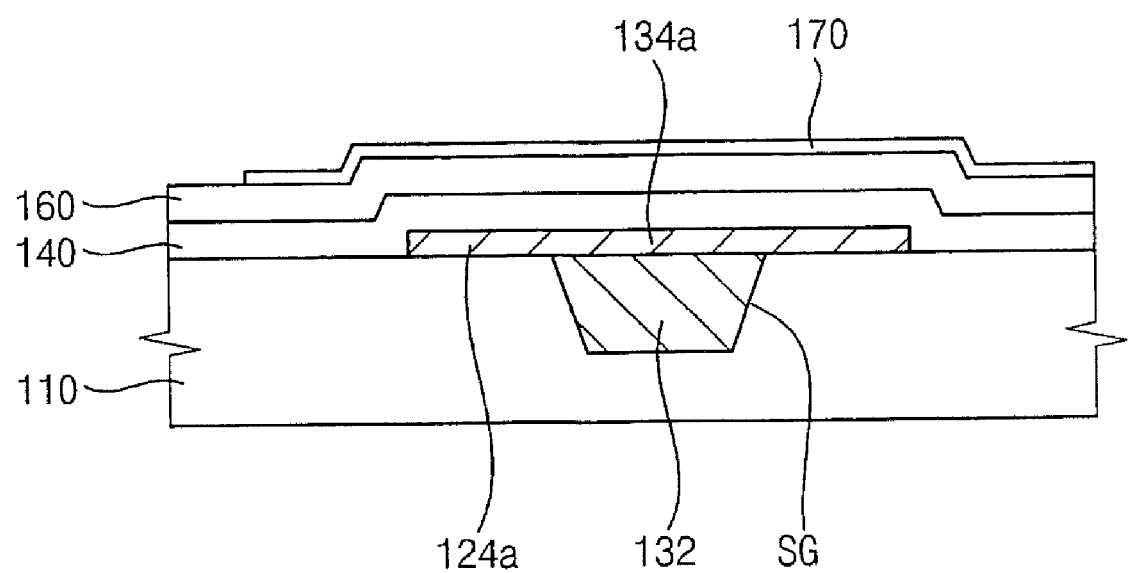
FIG. 5 is a cross-sectional view taken along line II-II' of FIG. 2.

FIG. 2 is an enlarged plan view schematically illustrating a portion of an exemplary array substrate of the exemplary display device of FIG. 1. FIG. 3 is a cross-sectional view taken along line I-I' of FIG. 2. FIG. 4 is a cross-sectional view schematically illustrating an exemplary TFT having another shape different from FIG. 3. FIG. 5 is a cross-sectional view taken along line II-II' of FIG. 2.

Referring to FIGS. 2, 3 and 5, the array substrate 100 according to the present invention includes a base substrate 110, a plurality of gate lines 120, a plurality of storage lines 130, a gate insulation layer 140, a plurality of data lines 150, a plurality of TFTs, a protecting layer 160 and a plurality of pixel electrodes 170. Here, each of the TFTs includes a gate electrode GE, a semiconductor pattern SP, a source electrode SE and a drain electrode DE.

The base substrate 110 may have a flat shape. The base substrate 110 may include an optically transparent material such as glass, quartz, plastic and so on. The base substrate 110 may have a display area displaying an image and a peripheral area surrounding the display area. For example, a plurality of unit pixels is formed in the display area, which is arranged in a matrix shape.

A plurality of gate receiving grooves GG is formed in the base substrate 110 along a first direction DI1. The gate receiving grooves GG have a width formed along a second direction DI2 crossing the first direction DI1, and the gate receiving grooves GG are formed in parallel with each other. The first and second directions DI1 and DI2 are substantially perpendicular with each other. The gate receiving grooves GG may be extended along the first direction DI1. Each of depths of the gate receiving grooves GG may be no less than about 1 μm. For example, the gate receiving grooves GG may have a depth of about 1 μm to about 5 μm.

A plurality of storage receiving grooves SG is formed in the base substrate 110 along the first direction DI1, which is spaced apart from the gate receiving grooves GG. The storage receiving grooves SG have a width formed along the second direction DI2, and the storage receiving grooves SG are formed in parallel with each other. The storage receiving grooves SG may be extended along the first direction DI1. Each of depths of the storage receiving grooves SG may be no less than about 1 μm. For example, the storage receiving grooves SG may have a depth of about 1 μm to about 5 μm.

Each of the gate lines 120 includes a gate main line 122 and a gate covering line 124.

The gate main line 122 is formed in the gate receiving groove GG of the base substrate 110. The gate main line 122 may fully or substantially fully fill up the gate receiving grooves GG. That is, an upper surface of the gate main line 122 formed in the gate receiving grooves GG may be in parallel or substantially parallel with that of the base substrate 110, such that the upper surface of the gate main line 122 is at least substantially flush or coplanar with an upper surface of the base substrate 110. In an exemplary embodiment, a thickness of the gate main line 122 may be about 1 μm to about 5 μm. The gate main line 122 may include, for example, an aluminum (Al) series metal such as aluminum, aluminum alloy, etc., a silver (Ag) series metal such as silver, silver alloy, etc., a copper (Cu) series metal such as copper, copper alloy, etc., a molybdenum (Mo) series metal such as molybdenum, molybdenum alloy, etc., and a metal including chromium (Cr), titanium (Ti), tantalum (Ta), tungsten (W), silver (Ag), copper (Cu), an alloy thereof, etc. In an exemplary embodiment, the gate main line 122 may include a multilayer structure that includes two electrically conductive films (not shown) that are different from each other. One of the conductive films may include a low resistivity metal such as an aluminum (Al) series metal, a silver (Ag) series metal, a copper (Cu) series metal, etc., so as to decrease a signal delay or a voltage drop. The remaining conductive film may include a material having superior adhesive characteristics with indium tin oxide ("ITO") and indium zinc oxide ("IZO"), such as a molybdenum (Mo) series metal, chromium (Cr), titanium (Ti), tantalum (Ta), etc. One example of a combination of materials for the gate main line 122 may include a lower layer of chromium and an upper layer of aluminum. Another example of a combination of materials for the gate main line 122 may include a lower layer of aluminum and an upper layer of molybdenum.

The gate covering line 124 is formed on the gate main line 122 to cover the gate main line 122. A thickness of the gate covering line 124 is thinner than that of the gate main line 122. For example, the gate covering line 124 may have a smaller thickness capable of blocking lights. The gate covering line 124 may include the same material as the gate main line 122. Alternatively, the gate covering line 124 may include a material different than the material of the gate main line 122. In an exemplary embodiment, the gate covering line 124 may include an aluminum (Al) series metal such as aluminum, aluminum alloy, etc., a silver (Ag) series metal such as silver, silver alloy, etc., a copper (Cu) series metal such as copper, copper alloy, etc., a molybdenum (Mo) series metal such as molybdenum, molybdenum alloy, etc., and a metal including chromium (Cr), titanium (Ti), tantalum (Ta), tungsten (W), silver (Ag), copper (Cu), an alloy thereof, etc. In another exemplary embodiment, the gate covering line 124 may include a multilayer structure that includes two electrically conductive films (not shown) that are different from each other. One of the conductive films may include a low resistivity metal such as an aluminum (Al) series metal, a silver (Ag) series metal, a copper (Cu) series metal, etc., so as to decrease a signal delay or a voltage drop. The remaining conductive film may include a material having superior adhesive characteristics with indium tin oxide ("ITO") and indium zinc oxide ("IZO"), such as a molybdenum (Mo) series metal, chromium (Cr), titanium (Ti), tantalum (Ta), etc. One example of a combination of materials for the gate covering line 124 may include a lower layer of chromium and an upper layer of aluminum. Another example of a combination of materials for the gate covering line 124 may include a lower layer of aluminum and an upper layer of molybdenum.

The gate covering line 124 may include a gate covering portion 124a and a laser shorting portion 124b.

The gate covering portion 124a is formed on the gate main line 122 along the first direction DI1 to cover the gate main line 122. That is, in an exemplary embodiment, a width of the gate covering portion 124a is greater than that of the gate main line 122.

The laser shorting portion 124b is protruded from the gate covering portion 124a along the second direction DI2. The laser shorting portion 124b may be overlapped by a portion of the pixel electrode 170. The laser shorting portion 124b may perform a role of a laser shorting repair area where a high pixel defect generating a white light is changed into an off pixel defect. That is, when a laser beam is applied to the laser shorting portion 124b, the laser shorting portion 124b is electrically connected to the pixel electrode 170 so that the high pixel defect may be removed.

The gate covering line 124 and the gate electrode GE of the TFT may be formed from the same metal layer. The gate electrode GE is protruded from the gate covering portion 124a along the second direction DI2. A portion of the gate main line 122 may be formed below the gate electrode GE to be covered by the gate electrode GE.

When the gate covering line 124 and the gate main line 122 are formed from the same metal material, the gate covering line 124 may fully cover the gate main line 122. In an alternative exemplary embodiment, when the gate covering line 124 and the gate main line 122 are formed from metal material that is different from each other, the gate covering line 124 may not fully cover the gate main line 122. That is, the gate covering line 124 may cover at least a portion of the gate main line 122.

Each of the storage lines 130 is overlapped by each of the pixel electrodes 170, respectively. Each of the storage lines 130 includes a storage main line 132 and a storage covering line 134. In an exemplary embodiment, the storage lines 130 may be omitted.

The storage main line 132 is formed in the storage receiving groove SG of the base substrate 110. An upper surface of the storage main line 132 formed in the storage receiving groove SG may be in parallel, or at least substantially in parallel, with an upper surface of the base substrate 110. Thus, a thickness of the storage main line 132 may be about 1 μm to about 5 μm. In an exemplary embodiment, the storage main line 132 may include an aluminum (Al) series metal such as aluminum, aluminum alloy, etc., a silver (Ag) series metal such as silver, silver alloy, etc., a copper (Cu) series metal such as copper, copper alloy, etc., a molybdenum (Mo) series metal such as molybdenum, molybdenum alloy, etc., and a metal including chromium (Cr), titanium (Ti), tantalum (Ta), tungsten (W), silver (Ag), copper (Cu), an alloy thereof, etc. In an exemplary embodiment, the storage main line 132 may include a multilayer structure that includes two electrically conductive films (not shown) that are different from each other. One of the conductive films may include a low resistivity metal such as an aluminum (Al) series metal, a silver (Ag) series metal, a copper (Cu) series metal, etc., so as to decrease a signal delay or a voltage drop. The remaining conductive film may include a material having superior adhesive characteristics with indium tin oxide ("ITO") and indium zinc oxide ("IZO"), such as a molybdenum (Mo) series metal, chromium (Cr), titanium (Ti), tantalum (Ta), etc. One example of a combination of materials for the storage main line 132 may include a lower layer of chromium and an upper layer of aluminum. Another example of a combination of materials for the storage main line 132 may include a lower layer of aluminum and an upper layer of molybdenum.

In an exemplary embodiment, the storage covering line 134 is formed on the storage main line 132 to cover the storage main line 132. A thickness of the storage covering line 134 is thinner than that of the storage main line 132.

The storage covering line 134 and the gate covering line 124 may be formed from the same metal layer. As a result, a thickness of the storage covering line 134 may be equal to that of the gate covering line 124. The storage covering line 134 and the gate covering line 124 may be formed from the same metal material.

The storage covering line 134 may include a storage covering portion 134a and a storage electrode 134b.

The storage covering portion 134a is formed on the storage main line 132 along the first direction DI1 to cover the storage main line 132. That is, in an exemplary embodiment, a width of the storage covering portion 134a is wider than that of the storage main line 132. The storage covering portion 134a may be overlapped by a portion of the pixel electrode 170.

The storage electrode 134b may be protruded from the storage covering portion 134a along the second direction DI2 in order to increase an overlapping area between the storage electrode 134b and the pixel electrode 170.

When the storage covering line 134 and the storage main line 132 are formed from the same metal material, the storage covering line 134 may fully cover the storage main line 132. In an alternative exemplary embodiment, when the storage covering line 134 and the storage main line 132 are formed from a metal material that is different from each other, the storage covering line 134 may not fully cover the storage main line 132.

The gate insulation layer 140 is formed on the base substrate 110 to cover the gate line 124, the gate electrode GE and the storage covering line 134, as well as to cover exposed portions of the base substrate 110. The gate insulation layer 140 may include, for example, an insulation material such as silicon oxide (SiOx) and silicon nitride (SiNx).

The data lines 150 are formed on the gate insulation layer 140 along the second direction DI2, and are disposed substantially in parallel to each other along the first direction DI1. In an exemplary embodiment, the data line 150 may include an aluminum (Al) series metal such as aluminum, aluminum alloy, etc., a silver (Ag) series metal such as silver, silver alloy, etc., a copper (Cu) series metal such as copper, copper alloy, etc., a molybdenum (Mo) series metal such as molybdenum, molybdenum alloy, etc., and a metal including chromium (Cr), titanium (Ti), tantalum (Ta), tungsten (W), silver (Ag), copper (Cu), an alloy thereof, etc. In another exemplary embodiment, the data line 150 may include a multilayer structure that includes two electrically conductive films (not shown) that are different from each other. One of the conductive films may include a low resistivity metal such as an aluminum (Al) series metal, a silver (Ag) series metal, a copper (Cu) series metal, etc., so as to decrease a signal delay or a voltage drop. The remaining conductive film may include a material having superior adhesive characteristics with indium tin oxide ("ITO") and indium zinc oxide ("IZO"), such as a molybdenum (Mo) series metal, chromium (Cr), titanium (Ti), tantalum (Ta), etc. One example of a combination of materials for the data line 150 may include a lower layer of chromium and an upper layer of aluminum. Another example of a combination of materials for the data line 150 may include a lower layer of aluminum and an upper layer of molybdenum.

A source electrode SE of the TFT and a drain electrode DE of the TFT are spaced apart from each other, and are formed on the gate insulation layer 140. The source electrode SE is protruded from the data line 150 along the first direction DI1 to overlap a portion of the gate electrode GE. The drain electrode DE is spaced apart from the source electrode SE to overlap a portion of the gate electrode GE.

The data lines 150, the source electrodes SE and the drain electrodes DE are formed from the same metal layer through a patterning process.

A plurality of semiconductor patterns SP of the TFTs is formed between the gate insulation layer 140 and a data metal pattern that includes the data lines 150, the source electrodes SE and the drain electrodes DE. Each of the semiconductor patterns SP may include an active pattern AP and an ohmic contact pattern OP.

The active pattern AP may include amorphous silicon ("a-Si") or micro-crystalline silicon. The ohmic contact pattern OP is formed in correspondence with the source electrode SE and the drain electrode DE. The ohmic contact pattern OP may include amorphous silicon doped with impurities at a high concentration or micro-crystalline silicon doped with impurities at a high concentration.

The protecting layer 160, which will be referred to hereinafter as the passivation layer 160, is formed on the gate insulation layer 140 to cover the data lines 150, the source electrodes SE and the drain electrodes DE, as well as to cover exposed portions of the gate insulation layer 140. A pixel contact hole CH is formed through the passivation layer 160, which exposes a portion of the drain electrodes DE.

The pixel electrodes 170 may include an optically transparent and electrically conductive material. The pixel electrodes 170 are formed on the passivation layer 160 in the unit pixels, respectively, to be electrically connected to the drain electrodes DE, respectively. That is, the pixel electrode 170 is electrically connected to the drain electrode DE through the pixel contact hole CH of the passivation layer 160.

Referring to FIG. 4, the semiconductor patterns SP according to the present embodiment may be formed on the gate insulation layer 140 to correspond with the gate electrodes GE in a different manner from FIG. 3. That is, the active pattern AP is formed on the gate insulation layer 140 to overlap the gate electrode GE. The ohmic contact pattern OP may be formed between the active pattern AP and the source electrode SE, and may be formed between the active pattern AP and the drain electrode DE.

According to the present embodiment, as a thickness of the gate main line 122 is greater than that of the gate covering line 124, the gate main line 122 may have a lower resistance than the gate covering line 124. Thus, the gate signal that is transferred through the gate main line 122 may be quickly transferred along the first direction DI1. That is, a signal delay may be prevented when the gate signal is transferred along the gate line 120.

Hereinafter, an exemplary method of manufacturing the exemplary first substrate of FIG. 2 will be described.

Referring to FIGS. 2, 3 and 5, a portion of the base substrate 110 is removed, then the gate receiving groove GG is formed through the base substrate 110 along the first direction DI1. For one example, the gate receiving groove GG may be formed by etching a portion of the base substrate 110 through an etching solution. For another example, the gate receiving groove GG may be formed by removing a portion of the base substrate 110 through a laser beam. In this embodiment, when the gate receiving groove GG is formed through the base substrate 110, the storage receiving groove SG may be formed simultaneously through the base substrate 110.

Then, the gate main line 122 is formed in the gate receiving groove GG. When a metal material is filled in the gate receiving groove GG through a metal jetting method, the gate main line 122 may be formed in the gate receiving groove GG. In an exemplary embodiment, as a metal ink having a viscosity is filled in the gate receiving groove GG, the gate main line 122 may be formed. Here, the metal ink may include silver (Ag), platinum (Pt), copper (Cu), etc.

In an alternative exemplary embodiment, the gate main line 122 may be formed though an electrode-less planting ("ELP") method. For example, a metal seed is formed on a bottom surface of the gate receiving groove GG, and then the base substrate 110 having the metal seed is put into a solution including a metal that will be plated. As a result, the metal that will be plated grows by the metal seed formed at the bottom surface of the gate receiving groove GG, so that the gate main line 122 may be formed. For example, the metal seed may include molybdenum (Mo), and the metal that will be plated may include copper (Cu).

In this embodiment, when the gate main line 122 is formed in the gate receiving groove GG, the storage main line 132 may be formed in the storage receiving groove SG. The storage main line 132 may be formed at substantially the same time as the gate main line 122.

Then, a gate metal layer is formed on the base substrate 110, and then a portion of the gate metal layer is removed to form a gate metal pattern that covers the gate main line 122. The gate metal pattern includes the gate covering line 124 that covers the gate main line 122 and the gate electrode GE connected to the gate covering line 124. Moreover, the gate metal pattern may further include the storage covering line 134 that covers the storage main line 132.

Alternatively, when the gate covering line 124 and the storage covering line 134 are formed from the same metal material of the gate main line 122 and the storage main line 132, the gate covering line 124 and the storage covering line 134 may be formed to fully cover the gate main line 122 and the storage main line 132, respectively. This is because when the gate covering line 124 and the storage covering line 134 do not fully cover the gate main line 122 and the storage main line 132, portions of the gate main line 122 and the storage main line 132 may be etched when a portion of the gate metal layer is etched to form the gate metal pattern.

When the gate covering line 124 and the storage covering line 134 are formed from a metal material that is different from the gate main line 122 and the storage main line 132, the gate covering line 124 and the storage covering line 134 may not fully cover the gate main line 122 and the storage main line 132. This is because an etching solution, which will etch the gate metal layer, does not etch the gate main line 122 and the storage main line 132, or relatively etches the gate main line 122 and the storage main line 132 in a small amount.

Then, the gate insulation layer 140 is formed on the base substrate 110 to cover the gate metal pattern.

Then, a semiconductor layer is formed on the gate insulation layer 140, a data metal layer is formed on the semiconductor layer, and then a portion of the data metal layer is removed to form a data metal pattern. A portion of the semiconductor layer is again removed through the data metal pattern to form the semiconductor pattern SP.

Alternatively, as described in FIG. 4, the semiconductor pattern SP is formed, and then the data metal pattern may be formed. That is, a portion of the semiconductor layer formed on the gate insulation layer 140 is removed to form the semiconductor pattern SP in correspondence with the gate electrode GE. Then, the data metal layer is formed on the gate insulation layer 140 to cover the semiconductor pattern SP, and then a portion of the data metal layer is removed to form the data metal pattern.

Here, the data metal pattern includes the data line 150 formed on the gate insulation layer 140 in the second direction DI2, the source electrode SE connected to the data line 150 and the drain electrode DE spaced apart from the source electrode SE.

Then, the passivation layer 160 is formed on the gate insulation layer 140 to cover the data metal pattern, and then a portion of the passivaiton layer 160 is removed to form the pixel contact hole CH. The pixel contact hole CH may expose a portion of the drain electrode DE.

Then, a transparent electrode layer including the pixel electrode 170 is formed on the passivation layer 160. The pixel electrode 170 is electrically connected to the drain electrode DE through the pixel contact hole CH.

When the gate main line 122 is formed through a metal jetting method or an electrolysis-less planting ("ELP") method, a plurality of cracks may be generated in the gate main line 122 so that an opening defect of the gate main line 122 may be generated. However, when the gate covering line 124 is formed on an upper portion of the gate main line 122 as described in this embodiment, the opening defect of the gate main line 122 may be prevented.

Figure 6:
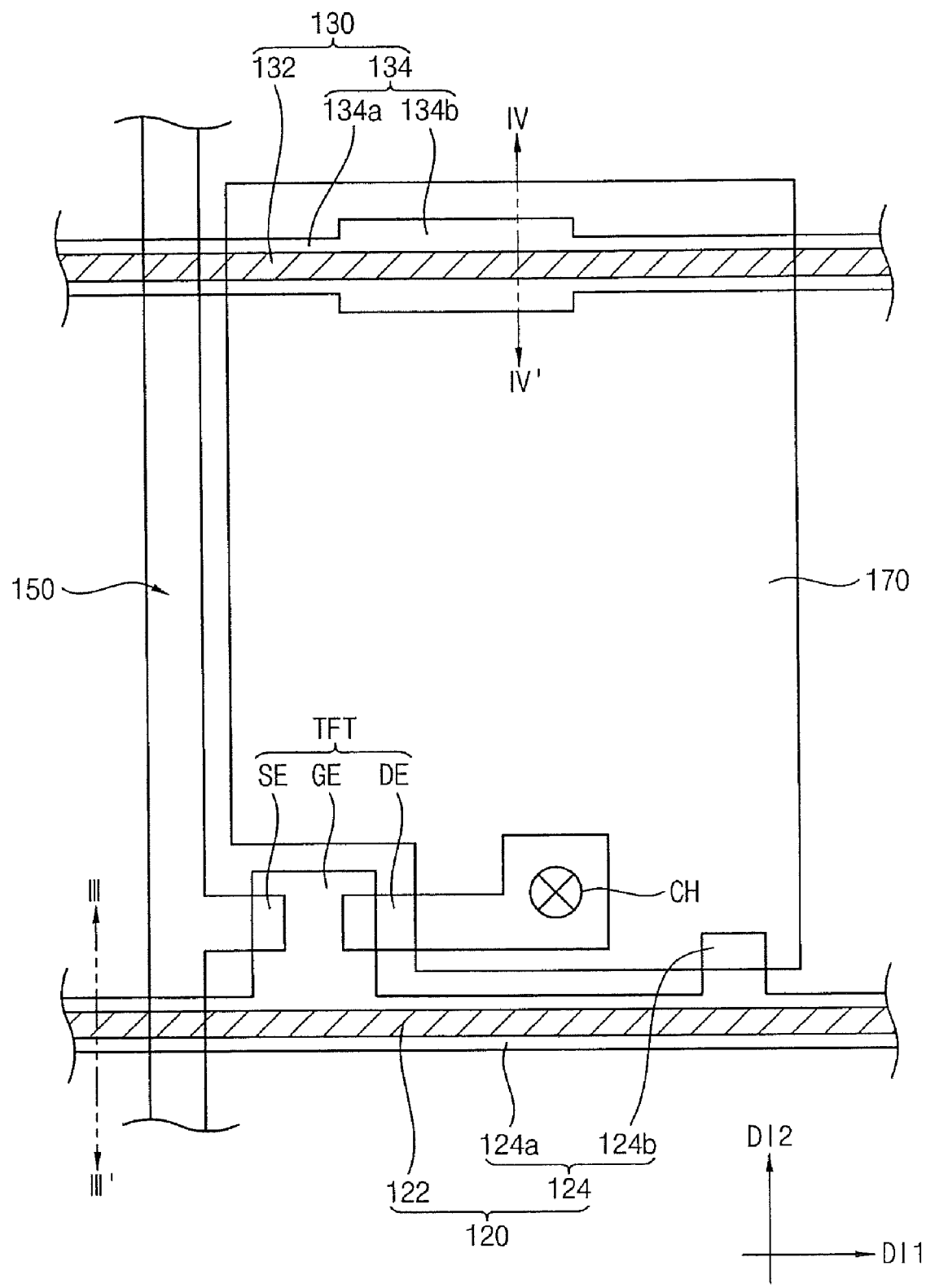
FIG. 6 is an enlarged plan view schematically illustrating a portion of an exemplary array substrate of the exemplary display device according to a second exemplary embodiment of the present invention.
Figure 7:
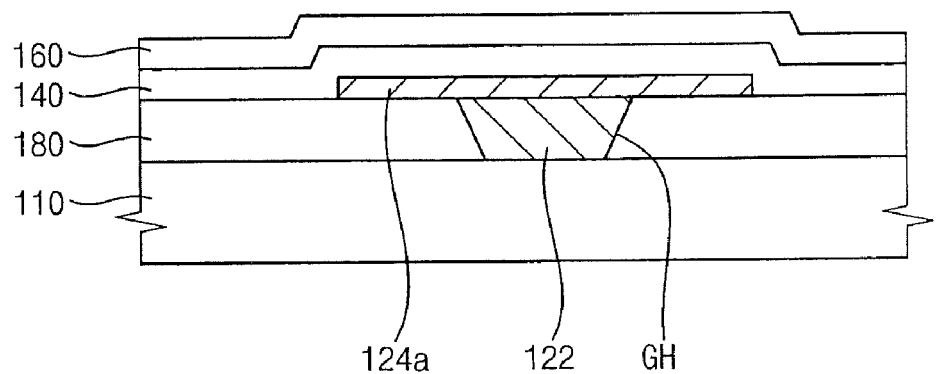
FIG. 7 is a cross-sectional view taken along line III-III' of FIG. 6.
Figure 8:
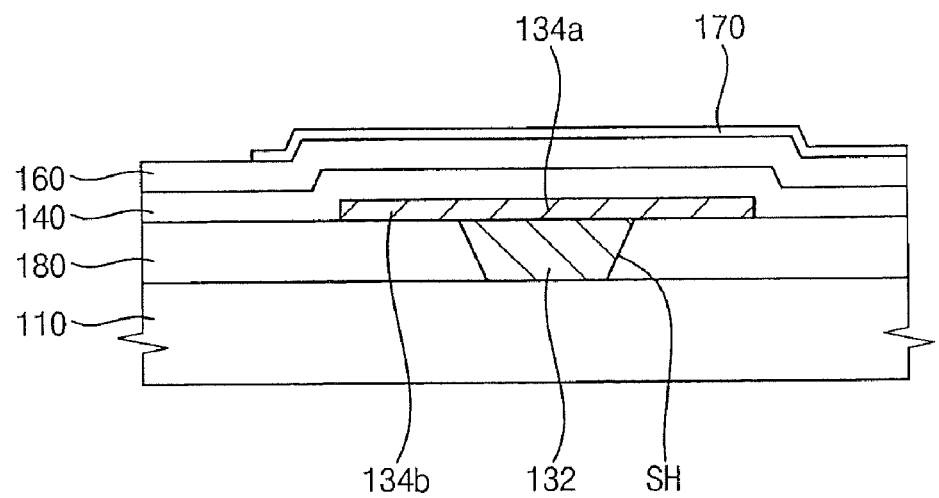
FIG. 8 is a cross-sectional view taken along line IV-IV' of FIG. 6.

FIG. 6 is an enlarged plan view schematically illustrating a portion of an exemplary array substrate of the exemplary display device according to a second exemplary embodiment of the present invention. FIG. 7 is a cross-sectional view taken along line III-III' of FIG. 6. FIG. 8 is a cross-sectional view taken along line IV-IV' of FIG. 6.

Referring to FIGS. 6 to 8, an array substrate according to a second exemplary embodiment is substantially the same as the array substrate according to the first exemplary embodiment except for a gate buffer layer 180, a gate line 120 and a storage line 130. Thus, identical reference numerals are used in the second exemplary embodiment to refer to components that are the same or like those shown in the first exemplary embodiment, and thus, a detailed description thereof will be omitted.

The first substrate of the present embodiment may further include the gate buffer layer 180 formed between the base substrate 110 and the gate insulation layer 140. The gate buffer layer 180 may include an organic insulating material or an inorganic insulating material.

A gate receiving hole GH is formed through the gate buffer layer 180 along the first direction DI1. A depth of the gate receiving hole GH may be no less than about 1 μm. For example, the depth of the gate receiving hole GH may be about 1 μm to about 5 μm. A bottom portion of the gate receiving hole GH may be removed to expose a portion of the base substrate 110. While the gate receiving hole GH is illustrated as exposing a portion of the base substrate 110, the gate receiving hole GH may alternatively not expose a portion of the base substrate 110. Also, the gate receiving hole GH may alternatively be termed a gate receiving groove in which case the gate receiving groove may or may not extend the full thickness of the gate buffer layer 180 such that the gate receiving groove may or may not expose a portion of the base substrate 110.

A storage receiving hole SH may be formed through the gate buffer layer 180 along the first direction DI1 to be spaced apart from the gate receiving hole GH. A depth of the storage receiving hole SH may be no less than about 1 μm. For example, the depth of the storage receiving hole SH may be about 1 μm to about 5 μm. A bottom portion of the storage receiving hole SH may be removed to expose a portion of the base substrate 110. Alternatively, the storage receiving hole SH may not expose a portion of the base substrate 110, and the storage receiving hole SH may alternatively be termed a storage receiving groove that may or may not extend the full thickness of the gate buffer layer 180 such that the storage receiving groove may or may not expose a portion of the base substrate 110.

The gate line 120 includes a gate main line 122 and a gate covering line 124.

The gate main line 122 is formed in the gate receiving hole GH of the gate buffer layer 180. The gate main line 122 may fill up the gate receiving hole GH. That is, an upper surface of the gate main line 122 formed in the gate receiving hole GH may be substantially in parallel with an upper surface of the gate buffer layer 180. The upper surface of the gate main line 122 may be substantially flush or coplanar with the upper surface of the gate buffer layer 180. Thus, a thickness of the gate main line 122 may be, for example, about 1 μm to about 5 μm.

The gate covering line 124 is formed on the gate main line 122 and on the gate buffer layer 180 to cover the gate main line 122. A thickness of the gate covering line 124 may be thinner than that of the gate main line 122. For example, the gate covering line 124 may have a minimum thickness which will block lights.

The gate covering line 124 may include a gate covering portion 124a and a laser shorting portion 124b. The gate covering portion 124a is formed on the gate main line 122 along the first direction DI1 to cover the gate main line 122. The laser shorting portion 124b is protruded from the gate covering portion 124a along the second direction DI2. The laser shorting portion 124b may be overlapped by a portion of the pixel electrode 170.

The gate covering line 124 and a gate electrode GE of the TFT may be formed from the same metal layer. The gate electrode GE is protruded from the gate covering portion 124a along the second direction DI2.

The storage line 130 is overlapped by the pixel electrodes 170, respectively. The storage line 130 may include a storage main line 132 and a storage covering line 134. In an exemplary embodiment, the storage lines 130 may be omitted.

The storage main line 132 is formed in the storage receiving hole SH of the gate buffer layer 180. An upper surface of the storage main line 132 formed in the storage receiving hole SH may be substantially in parallel with an upper surface of the gate buffer layer 180. The upper surface of the storage main line 132 may be substantially flush or coplanar with the upper surface of the gate buffer layer 180. Thus, a thickness of the storage main line 132 may be, for example, about 1 μm to about 5 μm.

The storage covering line 134 is formed on the storage main line 132 and on the gate buffer layer 180 to cover the storage main line 132. A thickness of the storage covering line 134 is thinner than that of the storage main line 132.

The storage covering line 134 is formed from the same metal layer identical to the gate covering line 124. As a result, the storage covering line 134 may have a thickness identical to that of the gate covering line 124, and may have the same metal material identical to the gate covering line 124.

The storage covering line 134 may include a storage covering portion 134a and a storage electrode 134b. The storage covering portion 134a is formed on the storage main line 132 along the first direction DI1 to cover the storage main line 132. The storage electrode 134b may be protruded from the storage covering portion 134a along the second direction DI2 in order to expand an overlapping size between the storage electrode 134b and the pixel electrode 170.

Hereinafter, an exemplary method of manufacturing the exemplary first substrate of FIG. 6 will be described.

Referring to FIGS. 6 to 8, the gate buffer layer 180 is formed on the base substrate 110, and then a portion of the gate buffer layer 180 is removed to form the gate receiving hole GH through the gate buffer layer 180 along the first direction DI1. In this embodiment, when the gate receiving hole GH is formed through the gate buffer layer 180, the storage receiving hole SH may be formed through the gate buffer layer 180 at substantially the same time.

Then, the gate main line 122 is formed in the gate receiving hole GH. In this embodiment, when the gate main line 122 is formed in the gate receiving hole GH, the storage main line 132 may be formed in the storage receiving hole SH at substantially the same time.

In this exemplary embodiment, the gate main line 122 and the storage main line 132 may fill up the gate receiving hole GH and the storage receiving hole SH, respectively, through a metal jetting method or an ELP method.

Then, a gate metal layer is formed on the gate buffer layer 180, and then a portion of the gate metal layer is removed to form a gate metal pattern that covers the gate main line 122. The gate metal pattern includes the gate covering line 124 that covers the gate main line 122, and the gate electrode GE connected to the gate covering line 124. Moreover, the gate metal pattern may include the storage covering line 134 that covers the storage main line 132.

Then, the gate insulation layer 140 is formed on the gate buffer layer 180 to cover the gate metal pattern.

A manufacturing process after forming the first substrate according to the exemplary embodiment of FIG. 6 is substantially the same as the manufacturing process of the first substrate according to the first exemplary embodiment of FIG. 2, and any further explanation will be omitted.

Figure 9:
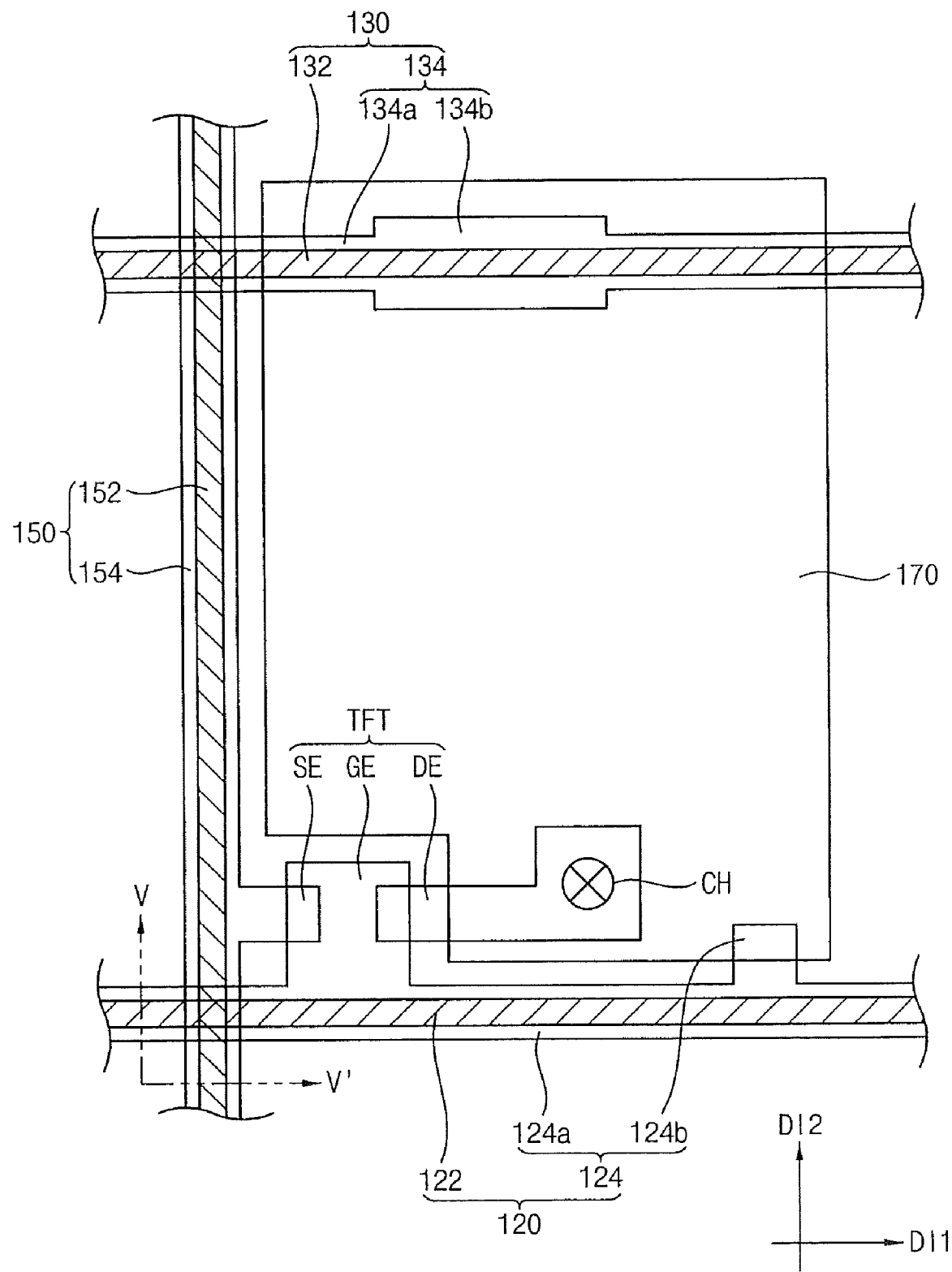
FIG. 9 is an enlarged plan view schematically illustrating a portion of an exemplary array substrate of the exemplary display device according to a third exemplary embodiment of the present invention.
Figure 10:
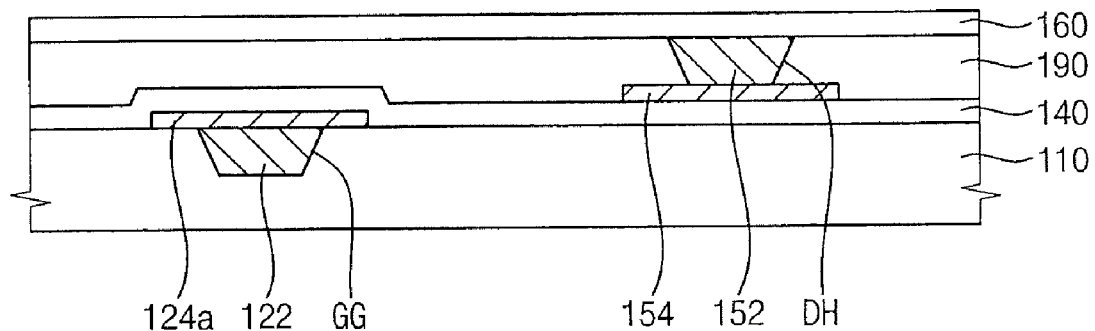
FIG. 10 is a cross-sectional view taken along line V-V' of FIG. 5.
Figure 11:
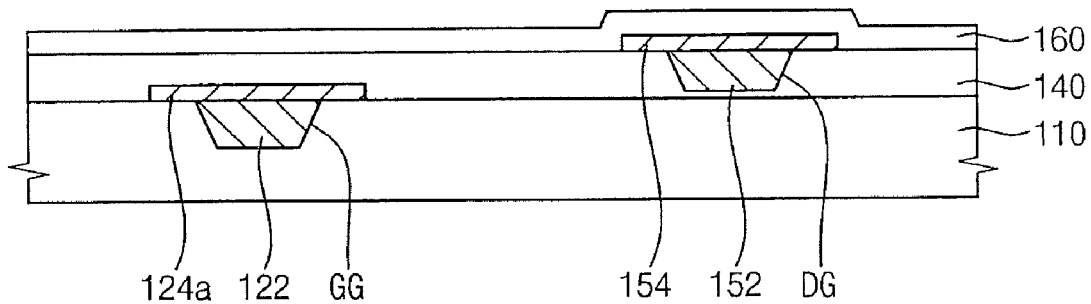
FIG. 11 is a cross-sectional view schematically illustrating an exemplary data line having another shape different from FIG. 10.

FIG. 9 is an enlarged plan view schematically illustrating a portion of an exemplary array substrate of the exemplary display device according to a third exemplary embodiment of the present invention. FIG. 10 is a cross-sectional view taken along line V-V' of FIG. 9. FIG. 11 is a cross-sectional view schematically illustrating an exemplary data line having another shape different from FIG. 10.

Referring to FIGS. 9 to 10, an array substrate according to a third exemplary embodiment is substantially the same as the array substrate according to the first exemplary embodiment except for a data buffer layer 190 and a data line 150. Thus, identical reference numerals are used in the third exemplary embodiment to refer to components that are the same or like those shown in the first exemplary embodiment, and thus, a detailed description thereof will be omitted.

In this exemplary embodiment, the data line 150 includes a data main line 152 and a data covering line 154. The first substrate further includes a data buffer layer 190 formed between the gate insulation layer 140 and the passivation layer 160.

The data covering line 154 is formed on the gate insulation layer 140 along the second direction DI2. The source electrode SE of the TFT is protruded from the data covering line 154 along the first direction DI1. The data covering line 154 may be formed by patterning the same metal layer such as the source electrode SE and the drain electrode DE of the TFT.

The data buffer layer 190 is formed on the gate insulation layer 140 to cover the data covering line 154. A data receiving hole DH for exposing a portion of the data covering line 154 is formed through the data buffer layer 190. The data receiving hole DH is extended along the data covering line 154. For example, a depth of the data receiving hole DH may be about 1 μm to about 5 μm.

The data main line 152 is formed in the data receiving hole DH. That is, the data main line 152 contacts the data covering line 154 to be extended along the data covering line 154. A thickness of the data main line 152 may be greater than that of the data covering line 154. An upper surface of the data main line 152 received in the data receiving hole DH may be in parallel with an upper surface of the data buffer layer 190. The upper surface of the data main line 152 may be substantially flush or coplanar with the upper surface of the data buffer layer 190. As a result, a depth of the data main line 152 may be about 1 μm to about 5 μm.

Hereinafter, an exemplary method of manufacturing the exemplary first substrate of FIGS. 9 and 10 will be described.

Referring to FIGS. 9 and 10, a method of manufacturing the first substrate according to this exemplary embodiment is substantially the same as the method of manufacturing the first substrate according to the first exemplary embodiment in the process for forming the semiconductor pattern SP and the data metal pattern, and any further explanation concerning the process for forming the semiconductor pattern SP and the data metal pattern will be omitted.

Here, the data metal pattern includes the data covering line 154 formed on the gate insulation layer 140 along the second direction DI2, the source electrode SE connected to the data covering line 154 and the drain electrode DE spaced apart from the source electrode SE.

After the semiconductor pattern SP and the data metal pattern are formed, the data buffer layer 190 is formed to cover the data metal pattern, and then a portion of the data buffer layer 190 is removed to form the data receiving hole DH. The data receiving hole DH is extended along the data covering line 154 to expose a portion of the data covering line 154.

Then, the data main line 152 is formed in the data receiving hole DH. The data main line 152 may be filled in the data receiving hole DH through a metal jetting method or an ELP method, so that the data main line 152 may be defined.

Then, the passivation layer 160 is formed on the data buffer layer 190 to cover the data main line 152.

Then, a portion of the passivation layer 160 and a portion of the data buffer layer 190 are removed to form the pixel contact hole CH. The pixel contact hole CH may expose a portion of the drain electrode DE.

Then, a transparent electrode layer including the pixel electrode 170 is formed on the passivation layer 160. The pixel electrode 170 is electrically connected to the drain electrode DE through the pixel contact hole CH.

Referring to FIGS. 9 and 10, the first substrate according to this embodiment may not include the data buffer layer 190. That is, when the data buffer layer 190 is omitted from the first substrate, as shown in FIG. 11, a data receiving hole DH may be formed through the gate insulation layer 140 along the second direction DI2. Here, a depth of the data receiving hole DH may be about 1 μm to about 5 μm.

For example, the data main line 152 is formed in the data receiving hole DH. Here, an upper surface of the data main line 152 formed in the data receiving hole DH may be substantially in parallel with that of the gate insulation layer 140. The data main line 152 may be substantially flush or coplanar with the upper surface of the gate insulation layer 140. As a result, a thickness of the data main line 152 may be, for example, about 1 μm to about 5 μm.

The data covering line 154 is formed on the data main line 152 along the data main line 152 to cover the data main line 152.

An exemplary method of manufacturing the exemplary first substrate of FIG. 11 is substantially the same as the method of manufacturing the first substrate according to the first exemplary embodiment except for at least the process for forming the data receiving groove DG on the gate insulation layer 140, and then filling the data main line 152 in the data receiving groove DG, and any further explanation concerning the process for forming the semiconductor pattern SP and the data metal pattern will be omitted.

As described, according to this exemplary embodiment, as a thickness of the data main line 152 is greater than that of the data covering line 154, the data main line 152 may have a relatively lower resistance than the data covering line 154. Therefore, a data signal may be quickly transferred through the data main line 152 along the second direction DI2.

Although exemplary embodiments of the present invention have been described, it is understood that the present invention should not be limited to these embodiments but various changes and modifications can be made by one ordinary skilled in the art within the spirit and scope of the present invention as hereinafter claimed.

What is claimed is:

1. An array substrate comprising:
a base substrate;
a gate line including a gate covering line formed in a first direction on the base substrate and a gate main line protruded from the gate covering line;
a gate insulation layer formed on the base substrate to cover the gate line;
a data line formed on the gate insulation layer in a second direction crossing the first direction;
a thin-film transistor electrically connected to the gate line and the data line; and
a pixel electrode electrically connected to the thin-film transistor,
wherein the base substrate includes a gate receiving groove formed thereon, the gate receiving groove receives the gate main line.

2. The array substrate of claim 1, wherein an upper surface of the gate main line received in the gate receiving groove is substantially coplanar with an upper surface of the base substrate.

3. The array substrate of claim 1, further comprising a gate buffer layer formed between the base substrate and the gate line, the gate buffer layer having a gate receiving groove that receives the gate main line.

4. The array substrate of claim 3, wherein an upper surface of the gate main line received in the gate receiving groove is substantially coplanar with an upper surface of the gate buffer layer.

5. The array substrate of claim 1, wherein a thickness of the gate main line is thicker than that of the gate covering line.

6. The array substrate of claim 1, wherein the gate covering line comprises:
a gate covering portion formed along the first direction to cover the gate main line; and
a laser shorting portion protruded from the gate covering portion toward the pixel electrode to be overlapped by a portion of the pixel electrode.

7. The array substrate of claim 6, wherein a gate electrode of the TFT is protruded from the gate covering portion toward the pixel electrode.

8. The array substrate of claim 7, wherein a portion of the gate main line is formed below the gate electrode to be covered by the gate electrode.

9. The array substrate of claim 1, wherein the data line comprises:
a data main line formed along the second direction; and
a data covering line formed along the second direction to cover the data main line.

10. The array substrate of claim 9, wherein the data covering line is formed on the gate insulation layer, and the data main line is formed on the data covering line.

11. The array substrate of claim 10, further comprising a data buffer layer formed on the gate insulation layer, the data buffer layer having a data receiving hole exposing at least a portion of the data covering line and receiving the data main line.

12. The array substrate of claim 9, wherein the data main line is formed on the gate insulation layer, and the data covering line is formed on the data main line.

13. The array substrate of claim 12, wherein the gate insulation layer has a data receiving groove formed through the gate insulation layer, which receives the data main line.

14. An array substrate comprising:
a base substrate;
a gate line formed on the base substrate;
a gate insulation layer formed on the base substrate to cover the gate line;
a data line formed on the gate insulation layer and crossing the gate line;
a thin-film transistor electrically connected to the gate line and the data line and having a gate electrode electrically connected to the gate line; and
a pixel electrode electrically connected to the thin-film transistor,
wherein the gate electrode of the thin-film transistor is thinner than a thinnest portion of the gate line.

15. The array substrate of claim 14, wherein the gate line includes a gate covering line formed on the base substrate and a gate main line disposed under the gate covering line.

16. The array substrate of claim 15, wherein the gate main line is thicker than the gate electrode of the thin-film transistor.

17. The array substrate of claim 16, wherein the gate electrode of the thin-film transistor is protruded from the gate covering line toward the pixel electrode.

18. The array substrate of claim 14, wherein the base substrate includes a gate receiving groove receiving the gate main line.

19. The array substrate of claim 15, wherein the gate covering line has a thickness substantially same as the gate electrode.

20. The array substrate of claim 15, wherein the gate covering line has a width greater than the gate main line.

* * * * *